United States Patent [19]

Rosen et al.

[11] 3,930,206

[45] Dec. 30, 1975

[54] BROAD-BAND AMPLIFIER USING CASCADED CLASS C AMPLIFIERS

[75] Inventors: Arye Rosen, Cherry Hill, N.J.; James Francis Reynolds, Beverly, Mass.

[73] Assignees: Robert L. Troike; RCA Corporation, New York, N.Y.

[22] Filed: Mar. 31, 1975

[21] Appl. No.: 563,813

Related U.S. Application Data

[63] Continuation-in-part of Ser. No. 466,796, May 3, 1974.

[52] U.S. Cl. .................................. 330/53; 330/61 A

[51] Int. Cl.[2] .......................................... H03F 3/60

[58] Field of Search ........................ 330/53, 34, 61 A

[56] References Cited

UNITED STATES PATENTS

| | | | |
|---|---|---|---|
| 3,293,447 | 12/1966 | Fleming | 330/34 X |
| 3,743,967 | 7/1973 | Fitzsimmons et al. | 330/34 X |
| 3,784,925 | 1/1974 | Chang et al. | 330/53 X |
| 3,784,926 | 1/1974 | Hill | 330/53 |

*Primary Examiner*—Nathan Kaufman
*Attorney, Agent, or Firm*—Edward J. Norton

[57] ABSTRACT

An avalanche diode is operated in the class C TRAPATT mode as an amplifier. Two or more class C TRAPATT amplifiers are cascaded to form a single broad-band microwave amplifier. The bandwidth of the microwave amplifier is the sum of the bandwidths of the individual cascaded class C TRAPATT amplifiers.

9 Claims, 6 Drawing Figures

BROAD-BAND AMPLIFIER USING CASCADED CLASS C AMPLIFIERS

The invention herein disclosed was made in the course of or under a contract or subcontract thereunder with the Department of the Army.

This is a continuation-in-part of U.S. application Ser. No. 466,796, filed May 3, 1974.

BACKGROUND OF THE INVENTION

The present invention relates to a broad-band microwave amplifier and more particularly to a microwave amplifier which uses cascaded class-C TRAPATT amplifier stages to achieve a broad-bandwidth capability.

The use of prior art cascaded solid-state IMPATT amplifying stages to achieve broad bandwidth capabilities at microwave frequencies has typically yielded low efficiency results, since each amplifier is always operating even though it is not contributing to the amplified output at a particular frequency. Operation of a single stage TRAPATT amplifier at class-C is known to increase the conversion efficiency significantly. The operation of TRAPATT amplifiers at class C is described by A. Rosen, J. F. Reynolds, S. G. Liu and G. E. Theriault in RCA Review Vol. 33, No. 4, December 1972, on pages 729 through 736. The article is entitled "Wideband Class-C Trapatt Amplifiers."

SUMMARY OF THE INVENTION

An amplifier for amplifying microwave signals above a given level over a given relatively broad band of frequencies includes a pair of avalanche diode amplifiers with each amplifier including a bandpass filter and a diode. The diodes are reversed biased by an amount requiring the microwave signals applied thereto to be above the given level to achieve negative conductance and amplification. The bandpass filter associated with the first amplifier is adapted to apply only signals above the given level at frequencies from generally $f_1$ through $f_2$ to the diode and to reflect substantially all other frequencies, where $f_1$ is at one end of the broad band of frequencies and $f_2$ is a frequency generally at the midfrequency of the broad band of frequencies. The bandpass filter associated with the second amplifier is adapted to couple only signals above the given level at frequencies from generally $f_2$ through $f_3$ to the diode of the second amplifier and to reflect substantially all other frequencies where $f_3$ is at the other end of the broad band of frequencies. A first coupling means applies the microwave signal to the first filter and couples the reflected signals to the second filter, whereby that portion of the microwave signals at frequencies from generally $f_1$ through $f_2$ are amplified and applied to the second amplifier and the reamining portion of the microwave signals are applied to the second amplifier without amplification. A second coupling means couples the microwave signals at the second filter to an output terminals, whereby microwave signals generally from frequency $f_2$ through $f_3$ are amplified by the second amplifier and applied to the output terminal and microwave signals generally below frequency $f_2$ are reflected at the second filter and applied to the output terminal without further amplification

DETAILED DESCRIPTION

Figure 1:
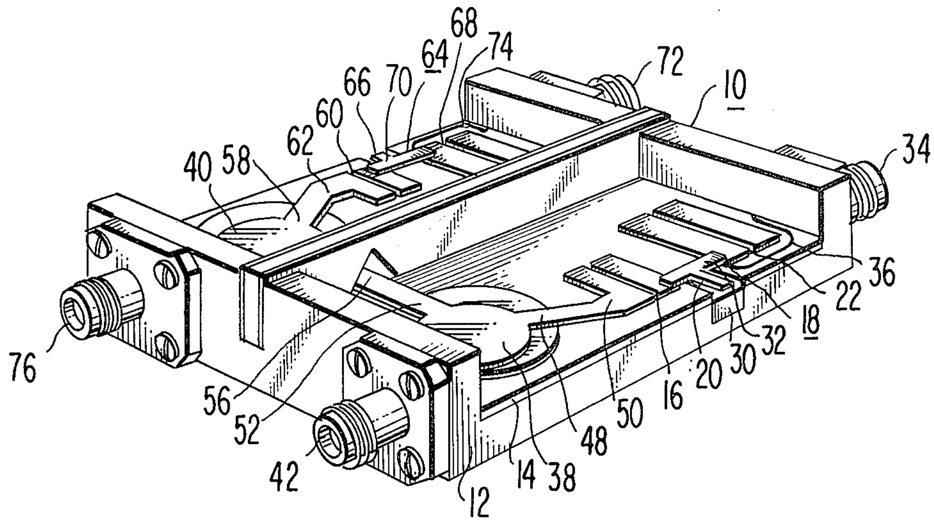
FIG. 1 is an isometric view of a form of the broad-band microwave amplifier of the present invention.
Figure 2:
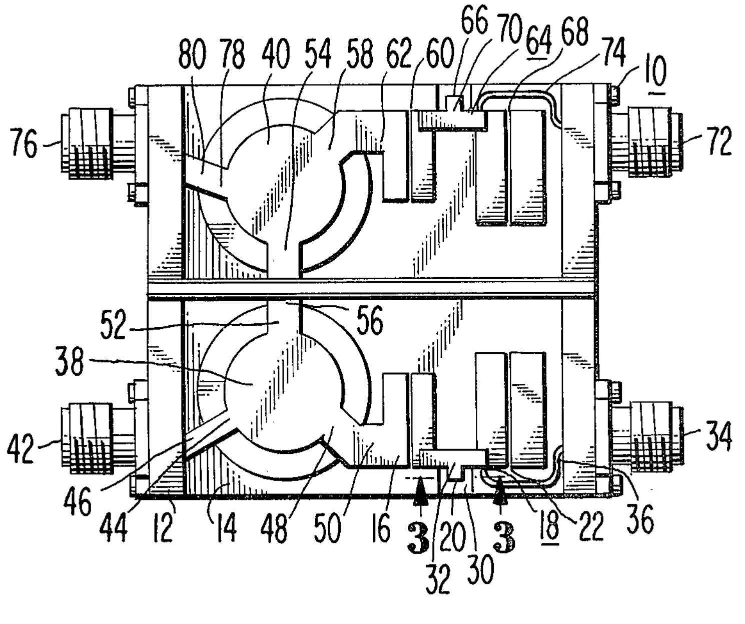
FIG. 2 is a top plan view of the embodiment of the invention as shown in FIG. 1.

Referring to FIGS. 1 and 2 of the drawing, there is shown a broad-band microwave amplifier generally designated as 10. The broad-band microwave amplifier 10 includes a substrate 12 of an electrically conductive metal, such as brass. The substrate 12 serves as a ground plane and support structure for the broad-band microwave amplifier. A flat plate 14 of an electrically insulating material, such as alumina, is mounted on and bonded to the upper surface of the substrate 12. A first amplifier comprises a first, coupled line bandpass reflection filter 16 and a first, class C TRAPATT amplifier, generally designated as 18. See previous cited reference of Rosen et al. in RCA Review of December 1972.

In class C TRAPATT amplifier operation, the TRAPATT diodes are DC reverse biased below the avalanche breakdown voltage level so that only negligible DC current flows in the diode when there is no RF input to the amplifier. When sufficient RF is applied, the TRAPATT diode is driven to the threshold (avalanche) condition for TRAPATT operation by the RF, whereupon the diode operation voltage drops and a large DC current is drawn from the DC bias voltage power supply causing a subsequent amplification of the RF signal. The structure of the TRAPATT may be of the n+ − p − p+ type or the p+ − n − n+ type as discussed on pages 732 and 733 of the referenced article of Rosen et al. in RCA Review of Dec. 1972. When the RF input falls below a certain low level, the conditions for TRAPATT operation are no longer met and the diode is automatically inoperative and negligible DC current flows in the diode. Since negligible current is being drawn by the diode in the off state below threshold condition for TRAPATT operations, there is negligible DC power dissipation in this state. The first class C TRAPATT amplifier 18 comprises a first TRAPATT diode assembly 20 and a first coupled bar idler circuit 22.

Figure 3:
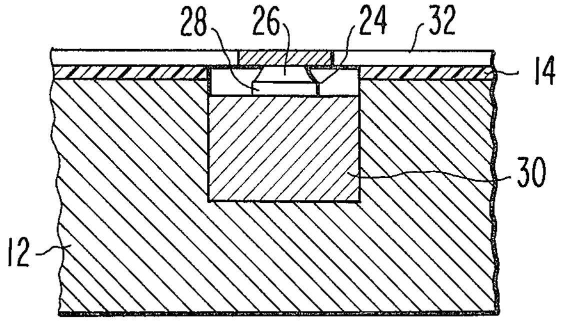
FIG. 3 is a sectional view taken along line 3—3 of FIG. 2.

Referring to FIG. 3, there is shown a sectional view of the first TRAPATT diode assembly 20. The first TRAPATT diode assembly 30 comprises a first TRAPATT diode 24, having a cathode electrode 26 and an anode electrode 28. The anode electrode 28 is electrically connected to a first TRAPATT diode mounting bock 30, having good electrical and head conductivity such as copper. The first TRAPATT diode mounting block 30 is mechanically and electrically connected to the substrate 12, such as by screws (not shown). The cathode electrode 26 of the first TRAPATT diode 24 is electrically connected, such as by soldering or brazing, to a first metal strip 32. The first metal strip 32 is electrically insulated from the substrate 12 by the flat plate of electrical insulating material 14.

Referring back to FIGS. 1 and 2, the cathode electrode 26 of the first TRAPATT diode 24 is electrically connected to the first coupled-line idler circuit 22 and the first coupled-line bandpass reflection filter 16 through the first metal strip 32. A first reverse bias signal application means comprises a first reverse bias signal input connector 34 and a first reverse bias signal lead 36. The first reverse bias signal input connector 34 is electrically connected to the cathode electrode 26 of the first TRAPATT diode 24 through the first reverse bias signal input lead 36 and the first metal strip 32.

A microwave signal directional routing means comprises a first Y junction three port circulator 38 and a second Y junction three port circulator 40. Each Y junction three port circulator is constructed in a manner suitable for single ground plane operation, such as described in U.S. Pat. No. 3,456,213. An RF input connector 42 is electrically connected to a first port 44 (see FIG. 2) of the first Y junction three port circulator 38 through a metal strip 46 (see FIG. 2). A second port 48 of the first Y junction three port circulator 38 is electrically connected to the first coupled bar reflection filter 16 through a metal strip 50. A third port 52 of the first Y junction three port circulator 38 is electrically connected to a first port 54 (see FIG. 2) of the second Y junction three port circulator 40 through a metal strip 56. A second port 58 of the second Y junction three port circulator 40 is electrically connected to a second coupled bar reflection filter 60 through a metal strip 62.

A second class C TRAPATT amplifier, generally designated as 64, comprises a second TRAPATT diode assembly 66 and a second coupled bar idler circuit 68. The construction of the second TRAPATT diode assembly 66 is substantially the same as the construction of the first TRAPATT diode assembly 20 as shown in FIG. 3, with the cathode electrode of the second TRAPATT diode being electrically connected to the second coupled-line idler circuit 68 and the second coupled-line bandpass reflection filter 60 through a second metal strip 70. A second reverse bias signal application means includes a second reverse bias signal input connector 72 and a second reverse bias signal input lead 74. The second reverse bias signal input connector 72 is electrically connected to the cathode electrode of the second TRAPATT diode through the second reverse bias signal input lead 74 and the second metal strip 70.

An output means comprises an RF output connector 76. A third port 78 (see FIG. 2) of the second Y junction three port circulator 40 is electrically connected to the RF output connector 76 through a metal strip 80 (see FIG. 2).

Figure 4:
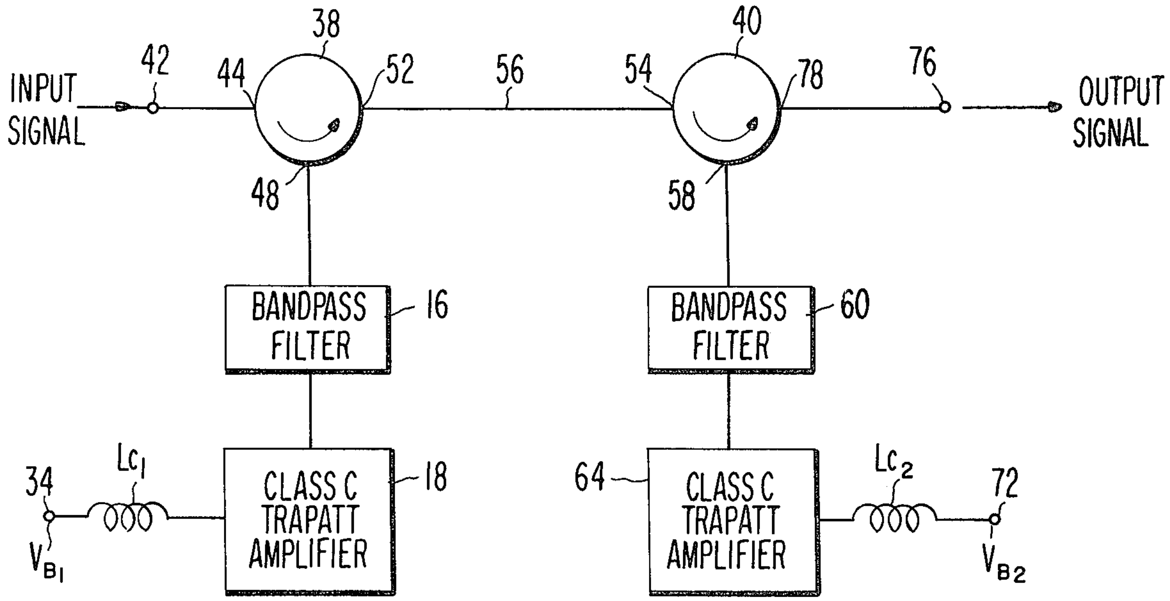
FIG. 4 is a schematic block diagram of the broad-band microwave amplifier of the present invention as represented by FIGS. 1, 2, and 3.

Referring to FIG. 4, there is shown a schematic block diagram of the broad-band microwave amplifier 10. The operation of the amplifier is best explained by use of a representative signal flow. For purposes of this example, an input signal, having a bandwidth of lower frequency $f_1$ and higher frequency $f_3$, is applied to the broad-band microwave amplifier 10 at the RF input connector 42. The input signal is applied via connector 42 to the first port 44 of the first circulator 38.

Figure 5:
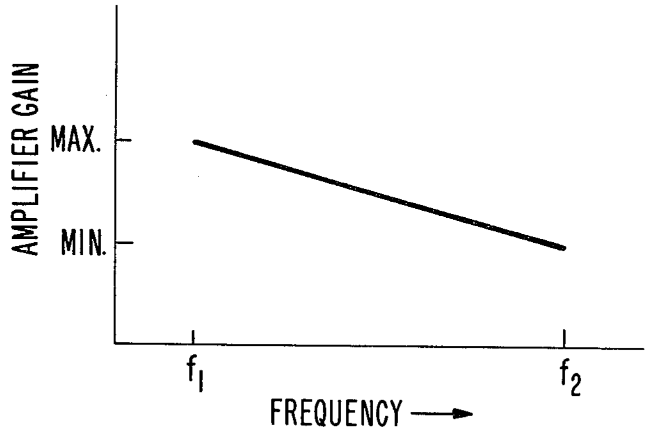
FIG. 5 is a plot of gain vs. frequency for the first amplifier in FIG. 4.

As described in U.S. Pat. no. 3,456,213, a circulator is a high frequency device of a type which directs electromagnetic input power therethrough in a non-reciprocal manner and which operates in the manner of a turnstile turning in the direction of the arrow shown and having ports distributed about its circumference. Consequently, the input signal applied at the first port 44 will exit at the second port 48. The first coupled-line bandpass reflection filter 16 has a bandpass with a lower cutoff frequency slightly below $f_1$ and an upper cutoff frequency slightly above $f_2$ (passes signals at frequencies $f_1$ thru $f_2$). The strips making up the first coupled-line bandpass reflection filter 16 are dimensioned and arranged to pass through all frequencies lying within the bandpass $f_2$ through $f_1$ while reflecting substantially all other frequencies. This is accomplished, for example, by making the length of the strip of filter 16 approximately one quarter wavelength long at a frequency from $f_1$ to $f_2$. Those signals at frequencies lying within the bandpass $f_2$ through $f_1$ are therefore passed through the filter 16 to the first class C TRAPATT amplifier 18, and bias this amplifier into the negative conductance region. The first class C TRAPATT amplifier 18 amplifies that portion of the input signal having frequencies lying within the band $f_2$ through $f_1$, which applied signals are fed back through the first coupled-line bandpass reflection filter 16 to the first circulator 38. The output gain vs. frequency may be like that shown in FIG. 5. At frequency $f_2$ the gain is near the minimum value and the gain increases linearly toward frequency $f_1$. Consequently, the signals appearing at the second port 48 of the first circulator 38 include amplified signals having frequencies within the $f_2$ through $f_1$ band and reflected signals having frequencies within the $f_3$ to $f_2$ band without amplification. These intermediate signals are thereafter routed by the circulator action to the third port 52 of the first circulator 38 and to the first port 54 of the second circulator 40 by way of the metal strip 56.

Figure 6:
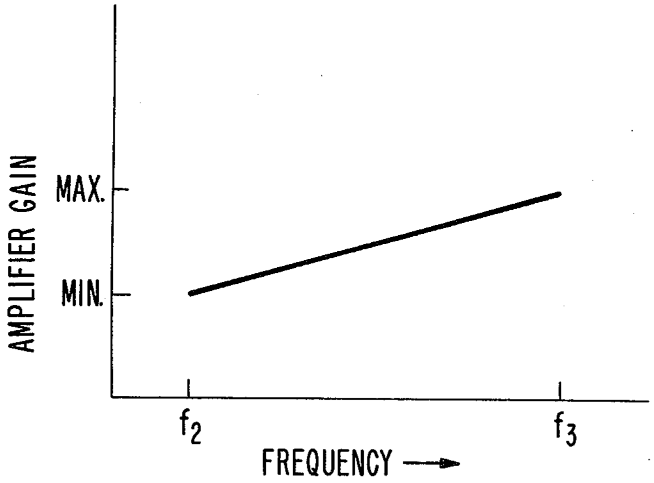
FIG. 6 is a plot of gain vs. frequency for the second amplifier in FIG. 4.

In the manner described previously, the intermediate signals appearing at the first port 54 of the second circulator 40 output at the second port 58 of the second circulator 40. The strips making up the second coupled-line bandpass reflection filter 60 are dimensioned and arranged to pass signals substantially from $f_2$ through $f_3$ with minimum reflection and to reflect all other frequencies above and below this passband. The strips making up filter 60 are approximately one quarter wavelength long at a frequency generally from $f_2$ through $f_3$. The signals above a given level at frequencies from $f_2$ through $f_3$ pass through the filter 60 and bias the second class C TRAPATT amplifier 64 into the negative conductance region, the filter 60 reflecting all other frequencies. The second class C TRAPATT amplifier 64 amplifies those signals at frequencies lying within the band $f_3$ through $f_2$, the amplified signals being fed back through the second coupled-line bandpass reflection filter 60 to the port 58 of the second circulator 40. The output gain vs. frequency for amplifier 64 may be like that shown in FIG. 6. At frequency $f_2$ the gain is near the minimum value. The gain increases linearly toward frequency $f_3$. The signal appearing at the second port 58 of the second circulator 40 includes the reflected portion of the intermediate signal plus the signals which have been amplified by the second class C TRAPATT amplifier 64. Consequently, the signal at port 58 can be viewed as having two amplified segments. There is a first amplified segment of frequencies substantially within the $f_2$ through $f_1$ frequency band provided by the first reflection amplifier 18, this amplified segment except generally for signals of frequency $f_2$ being reflected without further amplification at the second reflection amplifier 64. The second amplified segment includes signals of frequencies generally within the $f_3$ to $f_2$ frequency band, which signals are reflected at the first reflection amplifier 18, and amplified by the second reflection amplifier 64. Consequently, the signal at port 58 is an amplified signal having a total bandwith substantially equal to $f_3$ through $f_1$. The output signal is subsequently routed to the third port 78 of the second circulator 40 and thereafter to the RF output connector 76.

The TRAPATT diode 24 used herein, for example, is adapted such that the fundamental trapped plasma frequency (operating frequency) of the diode is approximately one half a frequency from $f_1$ through $f_2$. Similarly, the TRAPATT diode in assembly 66 has a fundamental operating frequency that is approximately one half a frequency from $f_2$ through $f_3$. The lengths of the coupled metal strips making up the idler circuit 22 are arranged to reflect the power at the fundamental and third harmonic back to the diode. The lengths of these strips may be for example approximately one quarter wavelength long at the fundamental operating frequency of the diode. The lengths of the coupled metal strips making up the idler circuit 68 are similarly dimensioned and arranged to reflect the power at the fundamental and third harmonic frequencies back to the diode. The bandpass filters 16 and 60 are dimensioned and arranged, in addition to providing high reactive impedances at frequencies outside their pass bands, to provide the proper matching to the diode at the second harmonic frequency of the TRAPATT diode. This is accomplished by the coupled strips being for example approximately a quarter wavelength long at the second harmonic of the operating frequency of the diodes.

The reverse signal application means essentially comprises a means for applying two pulsed or DC bias signals. The first external pulsed or DC bias signal $V_{B1}$ is applied to the first reverse bias signal input connector 34. The connector 34 is electrically connected to the cathode electrode 26 of the first TRAPATT diode 24 through the first reverse bias signal input lead 36. $L_{C1}$ represents the inductance associated with the first reverse bias signal input lead 36. The inductance $L_{C1}$ forms part of a filter network which allows application of the pulsed or DC bias voltage to the cathode electrode while preventing leakage of the microwave energy into the external DC power supply. A second pulsed or DC bias signal $V_{B2}$ is applied to the cathode electrode of the second TRAPATT diode through the second reverse bias signal input connector 72 and the second reverse bias signal input lead 74. $L_{C2}$ represents the inductance associated with the second reverse bias signal input lead 74. This inductance forms part of aa filter circuit which allows the pulsed or DC bias signal to be applied to the electrode while preventing leakage of the microwave energy back into DC bias power supply.

The operation described above is in contrast with devices such as LSA or Gunn devices, which cannot operate as class C amplifiers. Since these other devices cannot be operated as class C amplifiers, there is no off state; consequently, DC power is being dissipated regardless of whether RF power is applied. Since DC power is constantly being dissipated, the efficiency of cascaded amplifiers using these prior art devices is reduced by 50% when using two such amplifiers. In contrast, when TRAPATT devices are operated as class C amplifiers, and two such amplifiers are cascaded, either one amplifier or the other is dissipating DC power depending upon the frequency of the applied RF signal. Consequently, the DC conversion efficiency of the invention disclosed herein is equal to the efficiency of each cascaded amplifier. The use of the invention disclosed herein will cause a significant increase in the operational bandwidth of the output signal over the bandwidth of each component amplifier without reducing the overall DC conversion efficiency below that of each component amplifier.

What is claimed is:

1. An amplifier for amplifying microwave signals above a given level over a given relatively broad band of frequencies comprising:

a first avalanche diode amplifier including a first avalanche diode and a first bandpass filter with one terminal of the diode coupled to said first filter and the other terminal to a reflecting means, said first diode being reverse biased an amount requiring a signal above said given level to achieve negative conductance and amplification, said first filter adapted to apply signals only substantially at frequencies $f_1$ through $f_2$ above said given level to said diode and to reflect signals substantially above frequency $f_2$ without any amplification, where frequency $f_1$ is at one end of the broad band of frequencies and $f_2$ is a frequency generally at the mid-frequency of said broad band of frequencies;

a second avalanche diode amplifier including a second avalanche diode and a second bandpass filter with one terminal of said second diode coupled to said second filter and the other terminal to a reflecting means, said second diode being reverse biased an amount requiring a signal above said given level to achieve negative conductance and amplification, said second filter adapted to apply signals only substantially at frequencies $f_2$ through $f_3$ above said given level to said second diode and to reflect signals substantially below frequency $f_2$ and above frequency $f_3$ without amplification, where $f_3$ is at the other end of said broad band of frequencies;

first means for coupling microwave signals over said relatively broad band of frequencies to said first filter, and for coupling the reflected signals at said first filter to said second filter, whereby microwave signals substantially at frequencies $f_1$ through $f_2$ are amplified by said first amplifier and are reflected back through said first filter and applied to said second filter and microwave signals generally above frequency $f_2$ are reflected at said first filter and applied to said second filter without amplification; and second means for coupling the reflected signals at said second filter to an output terminal whereby microwave signals generally from frequency $f_2$ through $f_3$ are amplified by said second amplifier, are reflected back through said second filter and are applied to said output terminal, and microwave signals generally below frequency $f_2$ are reflected at said second filter and are applied to said output terminal without further amplification.

2. The combination claimed in claim 1 wherein said first and second amplifiers are adapted to operate with minimum gain at frequency $f_2$.

3. The combination claimed in claim 2, wherein said first amplifier is adapted to operate with maximum gain at $f_1$ and said second amplifier is adapted to operate with maximum gain at $f_3$.

4. The combination claimed in claim 1 wherein said first and second diodes are operated in a TRAPATT mode at a fundamental trapped plasma frequency.

5. The combination claimed in claim 1 wherein each of said first and second filters comprises a coupled line microstrip circuit.

6. The combination claimed in claim 5 wherein each of said first and second amplifiers includes an idler circuit coupled to said one terminal of said diode.

7. The combination claimed in claim 6 wherein said idler circuit is dimensioned and arranged to match the fundamental trapped plasma frequency of said diode and to reflect said fundamental frequency back to said diode.

8. The combination claimed in claim 6, wherein said idler circuit comprises a coupled line microstrip circuit.

9. The combination claimed in claim 1 wherein said first and second coupling means each include a junction circulator.

* * * * *

UNITED STATES PATENT OFFICE
CERTIFICATE OF CORRECTION

PATENT NO. : 3,930,206

DATED : December 30, 1975

INVENTOR(S) : Rosen et al

It is certified that error appears in the above-identified patent and that said Letters Patent are hereby corrected as shown below:

| | | |
|---|---|---|
| Cover Page | [73] | "Assignees: Robert L. Troike; RCA Corporation, New York, N.Y." should be -- Assignee: RCA Corporation, New York, N.Y. -- . |
| Column 2 | line 53 | "30" should be -- 20 --. |
| Column 2 | line 57 | "head" should be -- heat --. |
| Column 5 | line 48 | "aa" should be -- a --. |

Signed and Sealed this

*eleventh* Day of *May 1976*

[SEAL]

*Attest:*

RUTH C. MASON
*Attesting Officer*

C. MARSHALL DANN
*Commissioner of Patents and Trademarks*